(12) United States Patent
Fukuda

(10) Patent No.: US 8,344,770 B2
(45) Date of Patent: Jan. 1, 2013

(54) PLL CIRCUIT

(75) Inventor: Minoru Fukuda, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 143 days.

(21) Appl. No.: 12/929,776

(22) Filed: Feb. 15, 2011

(65) Prior Publication Data

US 2011/0199135 A1 Aug. 18, 2011

(30) Foreign Application Priority Data

Feb. 16, 2010 (JP) ................ P.2010-030815

(51) Int. Cl.
*H03L 7/06* (2006.01)

(52) U.S. Cl. ......... 327/156; 327/159; 375/373; 375/376

(58) Field of Classification Search .................. 327/156, 327/159; 375/376

See application file for complete search history.

(56) References Cited

U.S. PATENT DOCUMENTS

| | | | | |
|---|---|---|---|---|
| 5,530,389 | A * | 6/1996 | Rieder | 327/156 |
| 5,579,353 | A * | 11/1996 | Parmenter et al. | 375/376 |
| 6,111,442 | A * | 8/2000 | Aulet et al. | 327/156 |
| 6,469,553 | B1 * | 10/2002 | Sung et al. | 327/156 |
| 7,482,881 | B2 * | 1/2009 | Chien | 331/16 |
| 7,576,576 | B2 * | 8/2009 | Drexler et al. | 327/156 |
| 7,884,675 | B2 * | 2/2011 | Chien | 331/16 |
| 2005/0083099 | A1 * | 4/2005 | Lin | 327/295 |
| 2007/0103214 | A1 * | 5/2007 | Drexler et al. | 327/156 |
| 2009/0121793 | A1 * | 5/2009 | Chien | 331/16 |
| 2011/0121873 | A1 * | 5/2011 | Chien | 327/156 |

FOREIGN PATENT DOCUMENTS

| | | |
|---|---|---|
| JP | S61186533 | 11/1987 |
| JP | S63128816 | 6/1988 |
| JP | 04-291819 | 10/1992 |
| JP | 07-106960 | 4/1995 |
| JP | H07162302 | 6/1995 |
| JP | H07283730 | 10/1995 |
| JP | H07283731 | 10/1995 |
| JP | 09-261019 | 10/1997 |
| JP | 2007-318384 | 12/2007 |

* cited by examiner

*Primary Examiner* — Ryan Jager

(74) *Attorney, Agent, or Firm* — Jacobson Holman PLLC

(57) ABSTRACT

A PLL circuit is provided capable of reducing phase noise and facilitating design. In the PLL circuit, a PLL receives a reference frequency and an output from a VC-TCXO, performs a lock operation. In a lock state, a selector selects an output of a first divider that divides the reference frequency. When PLL detects input of reference frequency being lost or an unlock state, the PLL outputs an alarm signal to the selector. When receiving the alarm signal from the PLL, the selector switches from the output of the first divider to an output of a second divider that frequency-divides an output of the VC-TCXO, and outputs the same. Then, a PLL receives an output of the selector and an output of a VCXO and performs a lock operation.

8 Claims, 6 Drawing Sheets

PLL CIRCUIT

This application has a priority of Japanese no. 2010-030815 filed Feb. 16, 2010, hereby incorporated by reference.

BACKGROUND OF THE INVENTION

1. Field of the Invention

The present invention relates to a phase locked loop (PLL) circuit, and more particularly relates to a PLL circuit capable of reducing phase noise and facilitating design.

2. Description of the Related Art

Prior Art

[Conventional PLL Circuit: FIG. 6]

Referring to FIG. 6, a conventional PLL circuit is described below. FIG. 6 illustrates the configuration of a conventional PLL circuit.

As illustrated in FIG. 6, the conventional PLL circuit includes: a reference frequency input terminal 31; a PLL 32; a voltage controlled oscillator 33; a dependent frequency output terminal 34; and an alarm output terminal 35.

The PLL 32 receives a reference frequency from the reference frequency input terminal 31 and the output from the voltage controlled oscillator 33 as input, compares phase between them, and outputs a control signal in accordance with a phase difference to the voltage controlled oscillator 33.

When the phase comparison shows an unlock state, the PLL 32 outputs an alarm signal to the alarm output terminal 35.

The voltage controlled oscillator 33 uses a voltage controlled-temperature compensated crystal oscillator (VC-TCXO) to output an oscillatory frequency (dependent frequency) in accordance with the control signal from the PLL 32.

The conventional PLL circuit is configured to keep the control voltage output from the PLL 32 constant so as to maintain stability during free run when the reference frequency from the reference frequency input terminal 31 is lost.

[Another Conventional PLL Circuit: FIG. 7]

Referring next to FIG. 7, another conventional PLL circuit is described below. FIG. 7 illustrates the configuration of another conventional PLL circuit.

As illustrated in FIG. 7, this conventional PLL circuit includes: a reference frequency input terminal 41; a first PLL 42; a first voltage controlled oscillator (VC-TCXO) 43; a second PLL 44; a second voltage controlled oscillator (VCXO: voltage controlled crystal oscillator) 45; a dependent frequency output terminal 46; and an alarm output terminal 47.

In FIG. 7, the voltage controlled crystal oscillator (VCXO) is used as the second voltage controlled oscillator 45.

The PLL circuit in FIG. 7 is different from the PLL circuit in FIG. 6 in that the second PLL 44 receives the output from the first voltage controlled oscillator (VC-TCXO) 43 and the output from the second voltage controlled oscillator (VCXO) 45, compares phase between them, and outputs a control signal in accordance with a phase difference to the second voltage controlled oscillator (VCXO) 45, and the second voltage controlled oscillator (VCXO) 45 outputs a signal from the dependent frequency output terminal 46.

Related Art

Related art includes: Japanese Patent Application Laid-Open No. S63-128816 "PLL circuit" (Applicant: Toshiba Corporation/Patent Document 1), Japanese Patent Application Laid-Open No. H07-162302 "Double loop type PLL circuit" (Applicant: NEC Corp/Patent Document 2), Japanese Patent Application Laid-Open No. H07-283730 "Phase locked oscillator" (Applicant: Hitachi Communication System Inc/Patent Document 3), Japanese Patent Application Laid-Open No. H07-283731 "Synchronizing signal circuit" (Applicant: Matsushita Electric Ind Co Ltd/Patent Document 4), and Japanese Utility Model Application Laid-Open No. S62-186533 "Oscillator circuit" (Applicant: NEC Corp/Patent Document 5).

Patent Document 1 discloses a PLL circuit provided with a first PLL circuit 20 including a first phase comparator 21 and a first VCO 24 and a second PLL circuit including a second phase comparator 11 and a second VCO 14 with high frequency stability during free run, where the second PLL circuit is provided on the signal input side, the output from the second VCO 14 is input to the first phase comparator 21, and the output from the first VCO 24 is input to the second phase comparator 11.

Patent Document 2 discloses a double loop type PLL circuit in which when the input of a reference signal is lost, a selection circuit 3 selects an output signal of a M/m frequency dividing circuit 9, the output of a m-frequency dividing circuit 10 is input to phase comparators 4, 5, and the outputs from the phase comparators 4, 5 are made a pulse with duty of 50% so as to allow a VCXO 8 free-run in the vicinity of a center frequency.

Patent Document 3 discloses a phase locked oscillator in which even when an input signal 100 is lost, a frequency-division output 200 with high stability of frequency can be obtained from a first phase locked oscillator including a frequency divider 4 and a voltage controlled oscillator 3 having high stability of frequency, and a stable high frequency output can be obtained in proportion to the frequency of the input signal 100 from a second phase locked oscillator including a frequency divider 24.

Patent Document 4 discloses a synchronizing signal circuit including a first PLL circuit that receives a synchronous signal as input and a second PLL circuit including a phase comparator circuit, which receives an output signal of the first PLL circuit as input, in which the first PLL circuit performs automatic frequency control and the second PLL circuit performs frequency multiplication.

Patent Document 5 discloses an oscillator circuit including a first oscillator circuit having a voltage controlled oscillator 1 and a second oscillator circuit having a voltage controlled oscillator 6, in which an oscillatory output (output of the voltage controlled oscillator 1) of the first oscillator circuit is given to the second oscillator circuit as reference so as to obtain a highly-stable oscillatory output from the voltage controlled oscillator 6.

SUMMARY OF THE INVENTION

Although the conventional PLL circuit illustrated in FIG. 6 has a simple configuration as stated above, the voltage controlled TCXO 33 has to be newly designed for each required frequency, thus leading to a problem of difficulty in designing depending on stability.

The conventional PLL circuit illustrated in FIG. 7 can use an existing voltage controlled oscillator (VC-TCXO) and does not require very high stability for the second voltage controlled oscillator (VCXO) 45. However, the output of the first voltage controlled oscillator (VC-TCXO) 34 locked by the first PLL 42 is further locked with the second voltage controlled oscillator (VCXO) 45 by the second PLL 44, thus leading to a problem of degradation in phase noise.

In view of the above-stated circumstances, it is an object of the present invention to provide a PLL circuit capable of reducing phase noise and facilitating design.

In order to cope with the above-stated problems in the conventional techniques, a PLL circuit of the present invention includes: a first divider that divides a reference frequency; a voltage controlled-temperature compensated crystal oscillator that is a crystal oscillator to compensate for temperatures and makes an oscillatory frequency variable in accordance with an input control voltage; a first control signal generator that receives the reference frequency and an output from the voltage controlled-temperature compensated crystal oscillator as input, performs a lock operation, and outputs an alarm signal that is a first value (logic L) in a lock state and is a second value (logic H) when input of a reference frequency is lost or in an unlock state, while outputting a control voltage to the voltage controlled-temperature compensated crystal oscillator; a second divider that frequency-divides an output from the voltage controlled-temperature compensated crystal oscillator; a selector that selects an output of the first divider when the alarm signal is the first value and selects an output of the second divider when the alarm signal is the second value; a voltage controlled crystal oscillator that makes an oscillatory frequency variable in accordance with an input control voltage; and a second control signal generator that receives an output of the selector and an output of the voltage controlled crystal oscillator, performs a lock operation, and outputs a control voltage to the voltage controlled crystal oscillator. When the input of the reference frequency is lost, the first control signal generator can use stable oscillatory frequency of the voltage controlled-temperature compensated crystal oscillator, and reference frequency can be dealt with by the first and the second dividers, the second control signal generator and the voltage controlled crystal oscillator, thus leading to advantages of facilitating design and reducing phase noise. Further, the PLL circuit of the present invention has an advantage that stability of the voltage controlled crystal oscillator can be made similar to stability of the voltage controlled-temperature compensated crystal oscillator.

In the PLL circuit of the present invention, the voltage controlled-temperature compensated crystal oscillator has frequency stability higher than frequency stability of the voltage controlled crystal oscillator and has a frequency variable range narrower than a frequency variable range of the voltage controlled crystal oscillator.

In the PLL circuit of the present invention, the first control signal generator detects input of a reference frequency being lost, and keeps a state where a constant control voltage is output to the voltage controlled-temperature compensated crystal oscillator.

In the PLL circuit of the present invention, a division ratio of the first divider and a division ratio of the second divider are adjusted and set so that a frequency output from the first divider and a frequency output from the second divider are equal to each other.

DESCRIPTION OF REFERENCE NUMERALS

Figure 1:
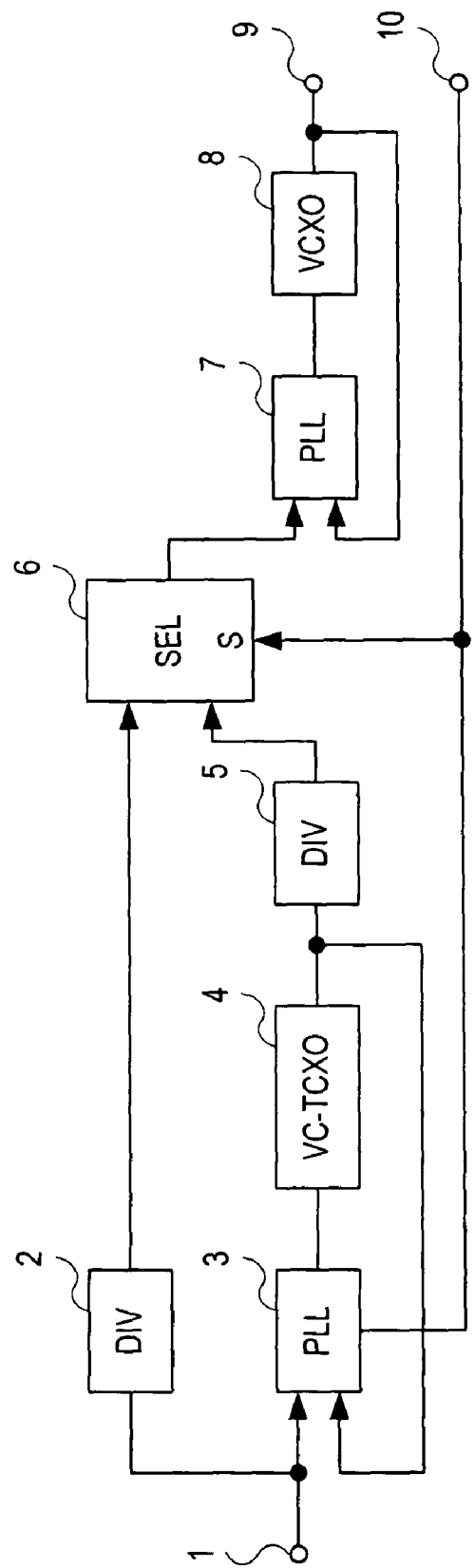
FIG. 1 is a block diagram illustrating the configuration of a PLL circuit according to one embodiment of the present invention.

1: reference frequency input terminal, 2: first divider (DIV), 3: first control signal generator (PLL), 4: voltage controlled-temperature compensated crystal oscillator (VC-TCXO), 5: second divider (DIV), 6: selector (SEL), 7: second control signal generator (PLL), 8: voltage controlled crystal oscillator (VCXO), 9: dependent frequency output terminal, 10: alarm output terminal, 11: reference frequency input terminal, 12: dependent VC-TCXO output signal input terminal, 13: divider (1/N), 14: divider (1/M), 15: divider (½), 16: flip-flop (F/F), 17: inverter gate, 18: selector (SEL), 19: phase comparator (PC), 20: low pass filter (LPF), 21: smooth signal output terminal, 22: alarm detector (ALMDET), 23: alarm output terminal, 31: reference frequency input terminal, 32: PLL, 33: voltage controlled oscillator, 34: dependent frequency output terminal, 35: alarm output terminal, 41: reference frequency input terminal, 42: first PLL, 43: first voltage controlled oscillator (VC-TCXO), 44: second PLL, 45: second voltage controlled oscillator (VCXO), 46: dependent frequency output terminal, 47: alarm output terminal, 101: second reference frequency-divisional input terminal, 102: second dependent frequency-divisional input terminal, 103: sampling clock input terminal, 104: counter (CNT), 105 to 107: flip-flop (F/F), 108: inverter gate, 109: AND gate, 110: flip-flop (F/F), 111: inverter gate, 112: AND gate, 113: inverter gate, 114: counter (CNT), 115: flip-flop (F/F), 116: inverter gate, 117: AND gate, 118: inverter gate, 119 to 120: AND gate, 121: inverter gate, 122: counter (CNT), 124: OR gate, 123: inverter gate, 125: alarm output terminal, 126: selection signal output terminal

DESCRIPTION OF PREFERRED EMBODIMENT

The following describes embodiments of the present invention, with reference to the drawings.

Summary of Embodiments

A PLL circuit according to one embodiment of the present invention includes a first control signal generator receiving a reference frequency and an output from a voltage controlled-temperature compensated crystal oscillator, and performing a lock operation. In a lock state, when detecting input of a reference frequency being lost or an unlock state, the first control signal generator outputs an alarm signal for reference frequency input loss or unlock, a selector receives an alarm signal for reference frequency input loss or unlock, and the selector switches from the output of the first divider to the output of the second divider and outputs the same. Then, a second control signal generator receives the output of the selector and the output of a voltage controlled crystal oscillator and performs a lock operation. During free run due to reference frequency input loss, the first control signal generator outputs a fixed control voltage, and can use a stable oscillatory frequency of the voltage controlled-temperature compensated crystal oscillator, and a reference frequency can be dealt with by the first and the second dividers, the second control signal generator and the voltage controlled crystal oscillator, thus leading to advantages of facilitating design and reducing phase noise.

[Configuration of PLL Circuit: FIG. 1]

Referring to FIG. 1, a PLL circuit according to one embodiment of the present invention is described below. FIG. 1 is a block diagram illustrating the configuration of a PLL circuit according to one embodiment of the present invention.

As illustrated in FIG. 1, the PLL circuit (the present circuit) according to one embodiment of the present invention basically includes: a reference frequency input terminal 1; a first divider (DIV) 2; a first control signal generator (PLL) 3; a voltage controlled-temperature compensated crystal oscillator (VC-TCXO) 4; a second divider (DIV) 5; a selector (SEL) 6; a second control signal generator (PLL) 7; a voltage controlled crystal oscillator (VCXO) 8; a dependent frequency output terminal 9; and an alarm output terminal 10.

[Units of PLL Circuit]

Various units of the present circuit are described below specifically.

The reference frequency input terminal 1 is a terminal at which a reference frequency is externally input.

The first divider (DIV) 2 receives the reference frequency as input, divides frequency thereof and outputs the same to the SEL 6.

The first control signal generator (PLL) 3 receives the reference frequency as well as the output (feedback output) from the VC-TCXO 4 as input, detects a phase difference between these input signals and outputs a control voltage based on the phase difference to the VC-TCXO 4 so as to make the feedback output locked with the reference frequency.

Then, when a lock state is established, the first control signal generator 3 detects it as a lock state and the SEL 6 selects the DIV 2. During a free-run state where the reference frequency is not input from the reference frequency input terminal 1 (reference frequency loss), the first control signal generator 3 outputs a fixed control voltage to the VC-TCXO 4.

The first control signal generator 3 further determines whether or not a phase difference exceeds a specific range. When the phase difference exceeds the specific range, the first control signal generator 3 detects it as an unlock state, and outputs an alarm signal to the SEL 6 and the alarm output terminal 10.

The first control signal generator 3 further detects a state where the reference frequency is not input, and outputs an alarm signal for reference frequency loss to the SEL 6 and the alarm output terminal 10.

More specifically, the state where the first control signal generator 3 does not output an alarm signal refers to a state where the first control signal generator 3 outputs a signal at a logic low level (logic L/a first value), and the state where the first control signal generator 3 outputs an alarm signal refers to a state where the first control signal generator 3 outputs a signal at a logic high level (logic H/a second value).

The voltage controlled-temperature compensated crystal oscillator (VC-TCXO) 4 is a temperature compensated crystal oscillator that outputs an oscillatory frequency in accordance with the control voltage from the PLL 3 to the second divider 5 and the PLL 3.

The second divider (DIV) 5 divides the oscillatory frequency from the VC-TCXO 4 and outputs the same to the SEL 6. Note here that division ratios of the dividers are adjusted and set so that the frequency output from the second divider 5 and the frequency output from the first divider 2 are equal to each other.

When receiving an alarm signal for reference frequency loss or unlock from the PLL 3, the selector (SEL) 6 performs an operation to select the output from the DIV 5.

The second control signal generator (PLL) 7 receives the output from the SEL 6 and the output from the VCXO 8 as input and outputs a control voltage corresponding to a phase difference between the input signals to the VCXO 8.

The voltage controlled crystal oscillator (VCXO) 8 generates a frequency in accordance with the control voltage from the PLL 7, and outputs an oscillatory frequency (dependent frequency) to the dependent frequency output terminal 9 and the PLL 7.

Herein, the VC-TCXO 4 has a higher stability than the VCXO 8, and the VC-TCXO 4 has a narrower locked range than the VCXO 8.

The dependent frequency output terminal 9 is a terminal at which a dependent frequency from the VCXO 8 is output.

The alarm output terminal 10 is a terminal at which an alarm signal for reference frequency loss or unlock from the PLL 3 is output.

[Operation of PLL Circuit]

The following describes an operation of the present circuit.

An operation is performed so that the PLL 3 makes the VC-TCXO 4 locked with the reference frequency from the reference frequency input terminal 1.

The second divider 5 divides frequency of the output from the VC-TCXO 4, and the SEL 6 receives a signal subjected to frequency division by the first divider 2 and a signal subjected to frequency division by the second divider 5 as input.

The PLL 3 is configured to detect reference frequency loss or unlock. Unless the reference frequency is lost or it is in an unlock state (normal state), the PLL 3 outputs an instruction signal to the SEL 6 so as to select a frequency division signal from the first divider 2. Herein, in the present embodiment, when an alarm signal for reference frequency loss or unlock is not input to the SEL 6, the first divider 2 is selected.

On the other hand, if the reference frequency is lost or it is in an unlock state (reference frequency loss), the PLL 3 outputs an instruction signal to the SEL 6 so as to select a frequency division signal from the second divider 5. In the present embodiment, when an alarm signal for reference frequency loss or unlock is input, the second divider 5 is selected.

The specific configuration and operation of the PLL 3 will be described later.

In response to an instruction signal from the PLL 3, the SEL 6 selects a frequency division signal from the first divider 2 or from the second divider 5, and outputs the same to the PLL 7.

The PLL 7 receives a signal from the SEL 6 and a signal from the VCXO 8 as input, performs a lock operation, and outputs a control voltage to the VCXO 8.

The VCXO 8 performs an oscillatory operation, and outputs a dependent frequency from the dependent frequency output terminal 9.

That is, in the case of a normal state where the reference frequency is not lost or it is not in an unlock state, the SEL 6 selects a frequency division signal from the first divider 2 and makes the PLL 7 and the VCXO 8 perform a lock operation.

If the reference frequency is lost or it is in an unlock state, the SEL 6 selects a frequency division signal from the second divider 5 and makes the PLL 7 and the VCXO 8 perform a lock operation.

Figure 2:
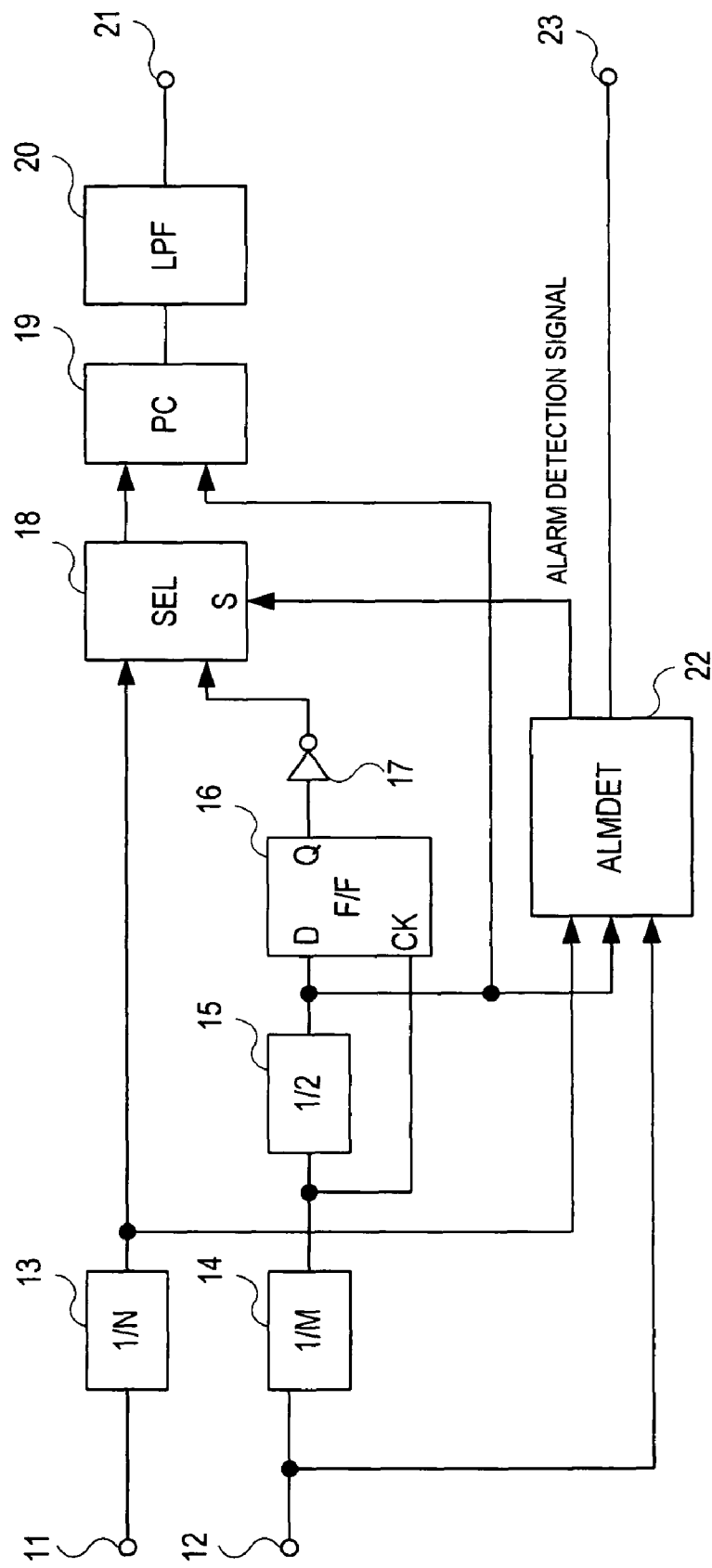
FIG. 2 illustrates the configuration of a first control signal generator 3 in the present circuit.

[First Control Signal Generator 3: FIG. 2]

Referring next to FIG. 2, the configuration of the first control signal generator 3 is described below. FIG. 2 illustrates the configuration of the first control signal generator 3 in the present circuit.

As illustrated in FIG. 2, the first control signal generator 3 includes: a reference frequency input terminal 11; a dependent TCXO output signal input terminal 12; a divider (1/N) 13; a divider (1/M) 14; a divider (½) 15; a flip-flop (F/F) 16; an inverter gate 17; a selector (SEL) 18; a phase comparator (PC) 19; a low pass filter (LPF) 20; a smooth signal output terminal 21; an alarm detector (ALMDET) 22; and an alarm output terminal 23.

The reference frequency input terminal 11 is the same as the reference frequency input terminal 1 in FIG. 1.

The dependent TCXO output signal input terminal 12 is a terminal at which the output from the VC-TCXO 4 of FIG. 1 is input.

The divider (1/N) 13 divides the reference frequency from the reference frequency input terminal 11 into 1/N and outputs the same to the selector 18 and the alarm detector 22.

The divider (1/M) 14 divides frequency of the output from the VC-TCXO 4 into 1/M and outputs the same to the divider (½) 15 and clock (CK) of the flip-flop 16.

The divider (½) 15 further divides the frequency-divided output from the divider (1/M) into ½, and outputs the same to an input terminal (D) of the flip-flop 16, the alarm detector 22 and the phase comparator 19.

The flip-flop 16 receives the output from the divider 15 at the input terminal (D) and the output from the divider 14 at the clock terminal (CK), shifts input data so as to be locked with a clock, and outputs the same from an output terminal (Q) to the inverter gate 17.

That is to say, the flip-flop 16 shifts the frequency from the divider 15 (½ of the frequency from the divider 14) using the frequency from the divider 14 as a clock, and outputs the same, i.e., shifts the phase of the frequency from the divider 15 by $\pi/2$ and outputs the same.

The inverter gate 17 inverts the output from the flip-flop 16 and outputs the same to the selector 18.

The selector (SEL) 18 receives the output from the divider 13 and the output from the inverter gate 17 as input. Unless an alarm detection signal for reference frequency loss is input from the alarm detector 22, the selector (SEL) 18 selects the output from the divider 13. If an alarm detection signal for reference frequency loss is input, the selector (SEL) 18 selects the output from the inverter gate 17, and outputs the selected signal to the phase comparator 19.

In the state where the output from the inverter gate 17 is selected and when an alarm detection signal for unlock is input from the alarm detector 22, the selector 18 selects the output from the divider 13 and outputs the selected signal to the phase comparator 19.

The phase comparator (PC) 19 receives the output from the selector 18 and the output from the divider (½) 15 as input, compares phase between these signals, and outputs a signal based on the phase difference to the low pass filter 20.

The low pass filter (LPF) 20 smoothes the output from the PC 19 and outputs the same to the smooth signal output terminal 21.

The smooth signal output terminal 21 is a terminal at which a smooth signal from the LPF 20 is output.

The alarm detector 22 receives the output from the divider (1/N) 13, the output from the divider (½) 15 and the output from the dependent TCXO output signal input terminal 12 as input, detects reference frequency loss and outputs the same to the selector 18. The alarm detector 22 further detects reference frequency loss or unlock and outputs it as an alarm detection signal to the alarm output terminal 23. The specific configuration and operation of the alarm detector 22 will be described later.

The alarm output terminal 23 is a terminal at which an alarm detection signal from the alarm detector 22 is output.

[Operation of First Control Signal Generator 3]

The following describes an operation of the first control signal generator 3.

The alarm detector 22 receives a signal obtained by dividing a reference frequency from the divider (1/N) 13 into 1/N as input and detects input loss (reference frequency loss) of the signal.

Then, when reference frequency loss is detected, the alarm detector 22 outputs a selection signal (an alarm detection signal for reference frequency loss) so as to make the selector 18 select the output (signal obtained by dividing frequency of the output from the VC-TCXO 4 into 1/M, further dividing it into ½ and inverting) from the inverter gate 17 instead of the reference frequency from the divider (1/N) 13.

More specifically, when the reference frequency is input from the divider 13, the alarm detector 22 outputs as a selection signal a signal at a logic low level (hereinafter simply referred to as "logic L"), and when the reference frequency is not input from the divider 13, the alarm detector 22 outputs as a selection signal a signal at a logic high level (hereinafter simply referred to as "logic H").

Then, the selector 18 selects the output from the divider 13 when the output of the selection signal is at logic L, and selects the output from the inverter gate 17 when the output of the selection signal is at logic H.

The phase comparator 19 is of an exclusive-OR type, and the output of the divider 15 is shifted in phase by $\pi/2$ by the flip-flop 16 at the rising edge of the divider 14 so as to output a substantially center value of the voltage at the smooth signal output terminal 21.

As a result, a signal of the same frequency but shifted in phase by $\pi/2$ is input to the phase comparator 19, so that the voltage at the smooth signal output terminal 21 that is the output from the low pass filter 20 is kept constant.

The divider 13 and the divider 15 output frequencies for the phase comparator 19, typically outputting the same frequency.

The alarm detector 22 detects reference frequency loss and unlock, and outputs logic H to the alarm output terminal 23. In a lock state, the alarm detector 22 outputs logic L to the alarm output terminal 23.

When detecting unlock, the alarm detector 22 outputs a selection signal of logic H to the selector 18 so that the selector 18 selects the output of the inverter gate 17, thus keeping the output voltage of the low pass filter 20 constant.

Figure 3:
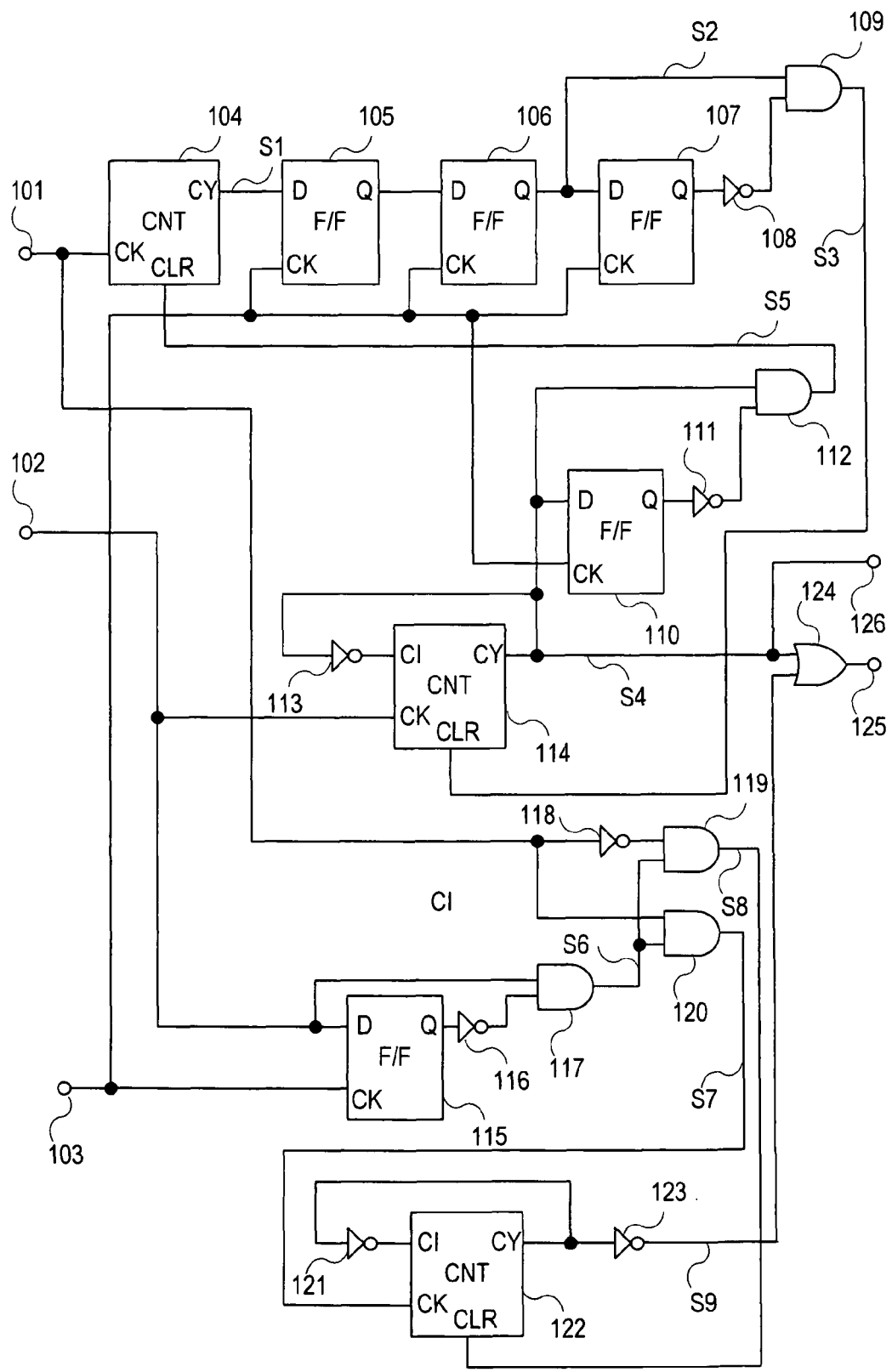
FIG. 3 illustrates the configuration of an alarm detector 22 in the first control signal generator 3.

[Alarm Detector 22: FIG. 3]

Referring now to FIG. 3, the configuration of the alarm detector 22 is described below. FIG. 3 illustrates the configuration of the alarm detector 22 in the first control signal generator 3.

As illustrated in FIG. 3, the alarm detector 22 includes: a second reference frequency-divisional input terminal 101; a second dependent frequency-divisional input terminal 102; a sampling clock input terminal 103; a counter (CNT) 104; flip-flops (F/F) 105 to 107; an inverter gate 108; an AND gate 109; a flip-flop (F/F) 110; an inverter gate 111; an AND gate 112; an inverter gate 113; a counter (CNT) 114; a flip-flop (F/F) 115; an inverter gate 116; an AND gate 117; an inverter gate 118; AND gates 119 to 120; an inverter gate 121; a counter (CNT) 122; an inverter gate 123; an OR gate 124; an alarm output terminal 125; and a selection signal output terminal 126.

The second reference frequency-divisional input terminal 101 is a terminal at which the output from the divider (1/N) 13 of FIG. 2 is input, and is connected to a clock terminal (CK) of the CNT 104, the inverter gate 118, and the AND gate 120.

The second dependent frequency-divisional input terminal 102 is a terminal at which the output from the divider (½) 15 of FIG. 2 is input, and is connected to CK of the CNT 114, an input terminal (D) of the F/F 115 and the AND gate 117.

The sampling clock input terminal 103 is a terminal at which the output from the dependent TCXO output signal input terminal 12 of FIG. 2 is input, and is connected to CK of the F/F 105 to 107, CK of the F/F 110, and CK of the F/F 115.

When counting a specific number of clocks with a signal from the second reference frequency-divisional input terminal 101 set as a clock, the CNT 104 outputs a signal to the input terminal (D) of the F/F 105 from an output terminal (CY). Then, the F/F 105 shifts the input signal and outputs the same to D of the F/F 106 from an output terminal (Q), and the F/F 106 further shifts the signal and outputs the same to D of the F/F 107 and the AND gate 109 from Q.

Q of the F/F 107 is input to the AND gate 109 via the inverter gate 108. That is, the output from the CNT 104 is shifted one by one and is output.

The AND gate 109 outputs the AND of the outputs from the F/F 106 and the inverter gate 108 and outputs the same to a clear terminal (CLR) of the CNT 114.

D of the F/F 110 receives the output from CY of the CNT 114 as input, and shifts the input signal with the output from the sampling clock input terminal 103 set as a clock and outputs the same to the inverter gate 111 from Q.

The AND gate 112 receives the output from the inverter gate 111 and the output from CY of the CNT 114 as input, and outputs the AND of them to the clear terminal (CLR) of the CNT 104.

The CNT 114 receives the output from CY that is inverted by the inverter gate 113 at CI, counts a specific number of clocks with the signal from the second dependent frequency-divisional input terminal 102 set as a clock from the rising edge of the input signal of CI, and outputs the count output to D of the F/F 110, the AND gate 112 and the OR gate 124.

The F/F 115 shifts the signal from the second dependent frequency-divisional input terminal 102 with the output from the sampling clock input terminal 103 set as a clock and outputs the signal to the inverter gate 116 from Q.

The AND gate 117 receives the inverted output from the inverter gate 116 and the output from the second dependent frequency-divisional input terminal 102 as input and outputs an AND signal of them to the AND gate 119 and the AND gate 120.

The AND gate 119 receives the signal from the AND gate 117 at one of the input terminals and the output from the second reference frequency-divisional input terminal 101 that is inverted by the inverter gate 118 at the other input terminal as input, and outputs an AND signal of them to CLR of the CNT 122.

The AND gate 120 receives the signal from the AND 117 at one of the input terminals and the output from the second reference frequency-divisional input terminal 101 at the other input terminal as input, and outputs an AND signal of them to CK of the CNT 122.

The CNT 122 receives the count output from CY that is inverted by the inverter gate 121 at CI, and outputs a signal from CY, which is inverted by the inverter gate 123 and is output to the OR gate 124.

More specifically, when logic low is output from CY, the CNT 122 counts a specific number of counts with logic high from the inverter gate 121 while setting the output from the AND gate 120 as a clock, and when the count is finished, the CNT 122 outputs logic high. Herein, the count is reset (cleared) by a signal from the AND gate 119.

The OR gate 124 receives the output from CY of the CNT 114 and the output from the inverter gate 123 as input, and outputs the logical OR thereof to the alarm output terminal 125.

[Operation of Alarm Detector 22]

Figure 4:
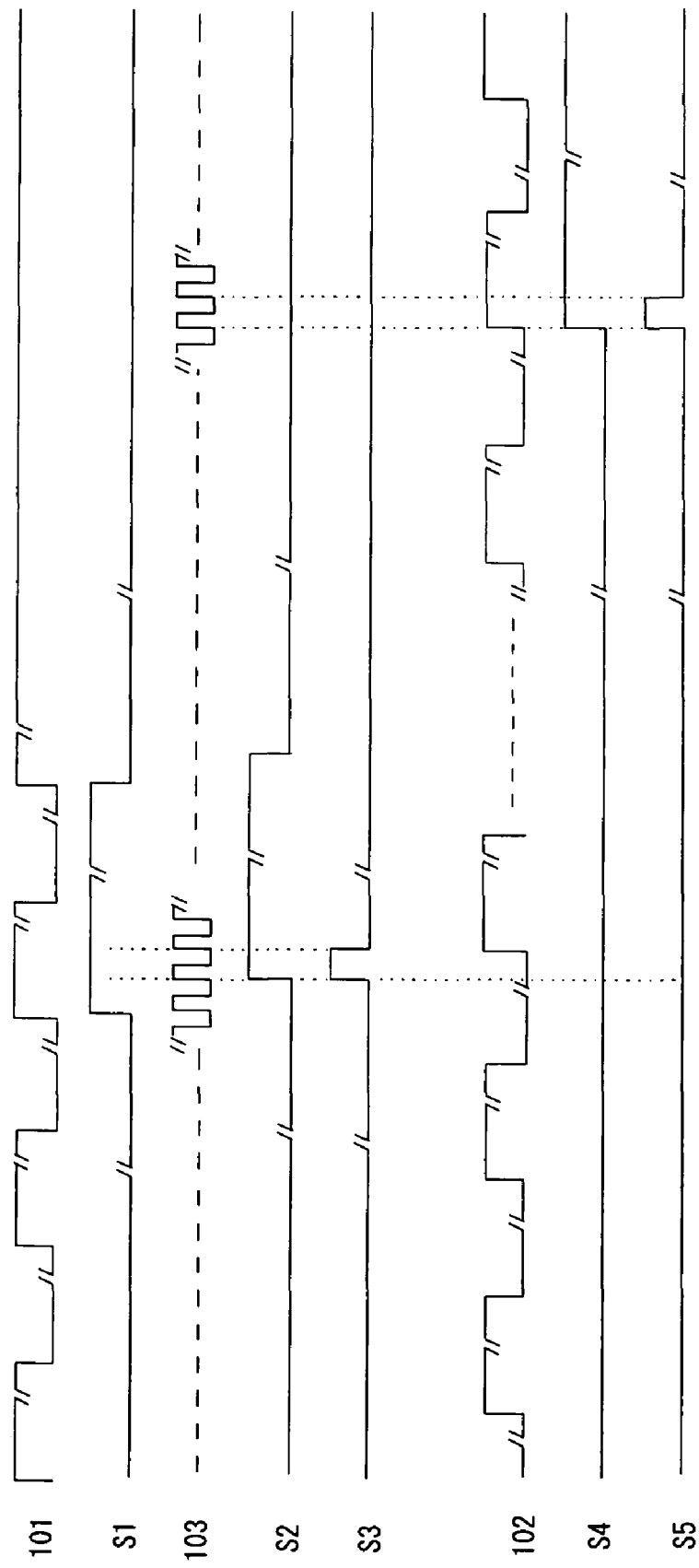
FIG. 4 is a timing chart when reference frequency is lost.
Figure 5:
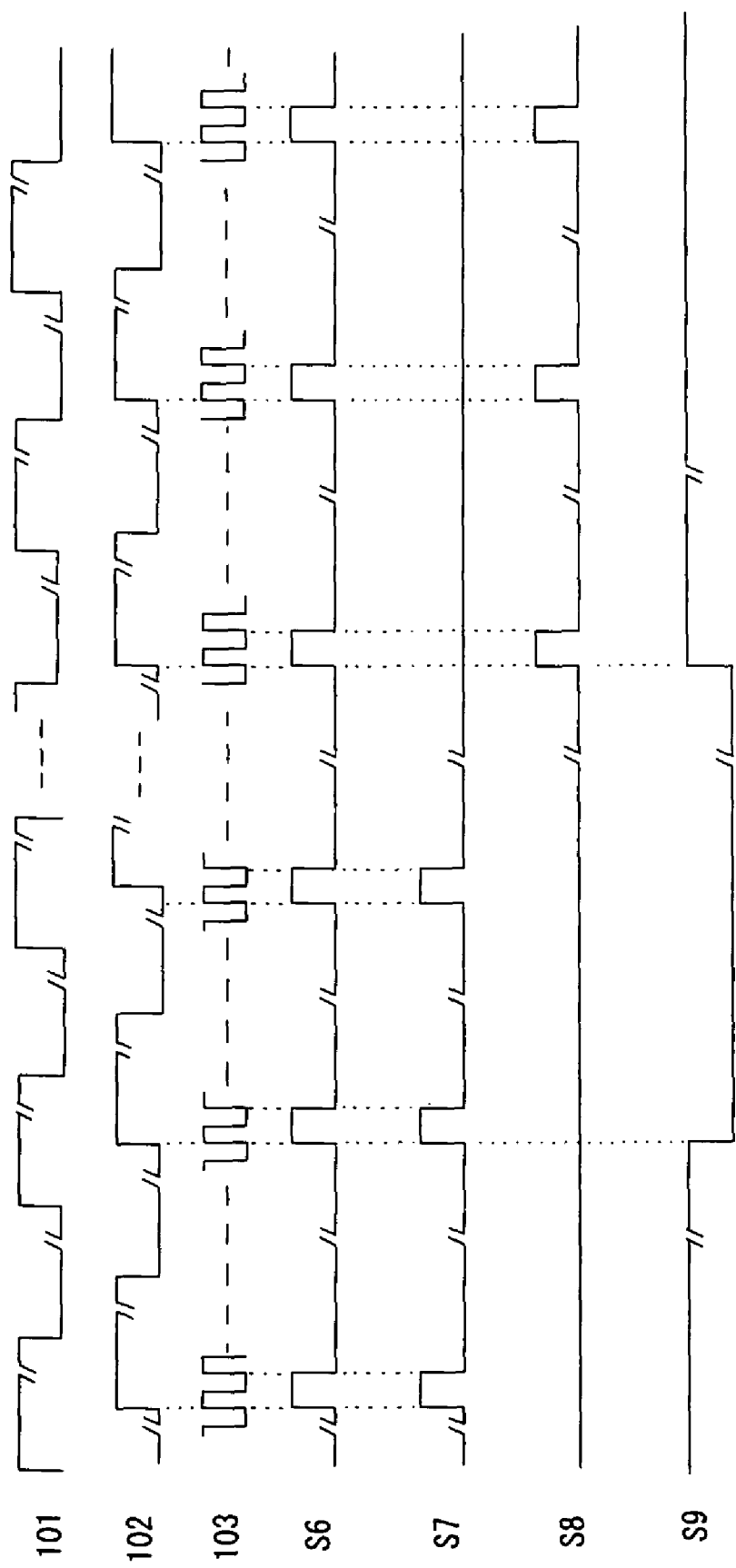
FIG. 5 is a timing chart in an unlock state.
Figure 6:
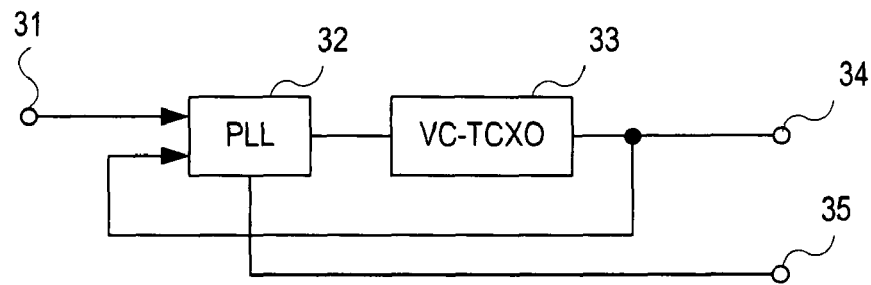
FIG. 6 illustrates the configuration of a conventional PLL circuit.
Figure 7:
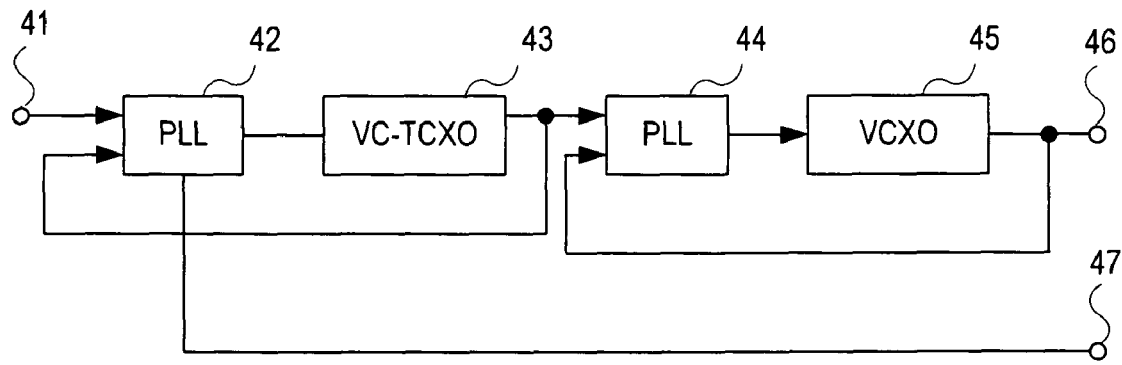
FIG. 7 illustrates the configuration of another conventional PLL circuit.

Referring to FIGS. 4 and 5, a signal state in the alarm detector of FIG. 3 is described below. FIG. 4 is a timing chart when reference frequency is lost, and FIG. 5 is a timing chart in an unlock state.

In FIGS. 4 and 5, a signal state S1 shows the output from CY of the CNT 104, S2 shows the output from Q of the F/F 106, S3 shows the output from the AND gate 109, S4 shows the output from CY of the CNT 114, S5 shows the output from the AND gate 112, S6 shows the output from the AND gate 117, S7 shows the output from the AND gate 120, S8 shows the output from the AND gate 119, and S9 shows the output from the inverter gate 123.

[Timing Chart when Reference Frequency is Lost: FIG. 4]

The counter 104 counts the rising edges of the second reference frequency-divisional input terminal 101. When the counter 104 counts a predetermined number of times, e.g., zero to the fifth time, the output S1 changes from logic low level (hereinafter referred to as logic L) to logic high level (hereinafter referred to as logic H). For the sixth time, the state returns to zero again, and S1 returns to logic L. Then the operation of zero to the fifth time is repeated similarly.

At the time of every rising edge of the clock of the sampling clock input terminal 103, the output S1 is shifted by the flip-flops 105, 106 and 107 one by one, so that S2 is output. As a result, S3 is output to the AND gate 109 so that logic H of 1 clock width is generated only at the rising-edge change of the output S2.

The counter 114 counts the rising edges of the second dependent frequency-divisional input terminal 102, where a predetermined number of times is set (count by the counter 104<count by the counter 114).

For instance, when the counter 114 counts 0 to the tenth, the output S4 changes to logic H, the output of the inverter gate 113 changes to logic L, and the counter 114 stops counting and does not accept the input of the second dependent frequency-divisional input terminal 102.

Herein, after the counter 114 receives logic H of the output S3 from the AND gate 109 at CLR so as to return to count 0, the counter 114 resumes counting at the timing of the rising edge of the second dependent frequency-divisional input terminal 102.

That is, as long as the rising edge of the second reference frequency-divisional input terminal 101 is continued, the counter 114 is returned to count 0 by logic H of the periodic output S3 before counting a predetermined number of times, and therefore the output S4 and the selection signal output terminal 126 keep logic L.

Thus, when the input to the second reference frequency-divisional input terminal 101 is lost, the counter 114 counts the input to the second dependent frequency-divisional input terminal 102 a predetermined number of times as a clock, and the output S4 and the selection signal output terminal 126 turn into logic H, thus detecting the presence or not of the input signal to the second reference frequency-divisional input terminal 101.

[Timing Chart in Unlock State: FIG. 5]

After the second dependent frequency-divisional input terminal 102 is delayed by the flip-flop 115 with a clock of the sampling clock input terminal 103, a logic H interval is obtained at the output S6 from the AND gate 117.

Further, in a lock state, when the output S6 is at logic H and the second reference frequency-divisional input terminal 101 is at logic H, logic H is obtained continuously at the output S7 from the AND gate 120.

On the other hand, in an unlock state, phase rotation occurs, and therefore the output S8 from the AND gate 119 may generate logic H when the second reference frequency-divisional input terminal 101 is at logic L.

Therefore, in a lock state, the CNT 122 counts the logic H of the output S7 set as a clock a predetermined number of times, e.g., zero to the seventh time, and then outputs logic H to the inverter gate 123. The inverter gate 123 inverts the logic H and outputs logic L to the output S9.

That is to say, the output S9 from the inverter gate 123 keeps logic L in a lock state and keeps logic H in an unlock state. Therefore, from the output S4 and the output S9 via the OR gate 124, logic H can be obtained at the alarm output terminal 125 when the input from the second reference frequency-divisional input terminal 101 is lost or in an unlock state, and logic L can be obtained in a lock state Advantages of Embodiments According to the present circuit, when a reference frequency is input, the PLL 3 and the VC-TCXO 4 perform a lock operation. When the PLL 3 is in a lock state, the SEL 6 selects a signal from the DIV 2, and when the PLL 3 detects reference frequency input loss or unlock, the SEL 6 selects a signal from the DIV 5, which is output to the PLL 7. The PLL 7 and the VCXO 8 controls an oscillatory frequency. The VC-TCXO 4 has higher frequency stability and narrower frequency variable range (lock range) than the VCXO 8, and therefore a stable oscillatory frequency by the VC-TCXO 4 can be used during free-run, and the reference frequency can be dealt with by the DIVs 2 and 5, the PLL 7 and the VCXO 8, thus leading to advantages of facilitating design and reducing phase noise.

Further, the present circuit has an advantage that the output of the dependent frequency output terminal 9 has stability similar to that of the VC-TCXO 4.

The present invention is suitable for a PLL circuit that reduces phase noise and facilitates design for VC-TCXO multiplication.

What is claimed is:

1. A PLL circuit comprising:
    a first divider that divides a reference frequency;
    a voltage controlled-temperature compensated crystal oscillator that is a crystal oscillator to compensate for temperatures and makes an oscillatory frequency variable in accordance with a first control voltage;
    a first control signal generator that receives the reference frequency and an output from the voltage controlled-temperature compensated crystal oscillator as input, performs a lock operation, and outputs an alarm signal that is a first value in a lock state and is a second value when input of the reference frequency is lost or in an unlock state, while outputting the first control voltage to the voltage controlled-temperature compensated crystal oscillator;
    a second divider that frequency-divides the output from the voltage controlled-temperature compensated crystal oscillator;
    a selector that selects an output of the first divider when the alarm signal is the first value and selects an output of the second divider when the alarm signal is the second value;
    a voltage controlled crystal oscillator that makes an oscillatory frequency variable in accordance with a second control voltage; and
    a second control signal generator that receives an output of the selector and an output of the voltage controlled crystal oscillator, performs a lock operation, and outputs the second control voltage to the voltage controlled crystal oscillator.

2. The PLL circuit according to claim 1, wherein the voltage controlled-temperature compensated crystal oscillator has frequency stability higher than frequency stability of the voltage controlled crystal oscillator and has a frequency variable range narrower than a frequency variable range of the voltage controlled crystal oscillator.

3. The PLL circuit according to claim 2, wherein the first control signal generator detects input of the reference frequency being lost, and keeps a state where the first control voltage output to the voltage controlled-temperature compensated crystal oscillator is constant.

4. The PLL circuit according to claim 3, wherein a division ratio of the first divider and a division ratio of the second divider are adjusted and set so that a frequency output from the first divider and a frequency output from the second divider are equal to each other.

5. The PLL circuit according to claim 2, wherein a division ratio of the first divider and a division ratio of the second divider are adjusted and set so that a frequency output from the first divider and a frequency output from the second divider are equal to each other.

6. The PLL circuit according to claim 1, wherein the first control signal generator detects input of the reference frequency being lost, and keeps a state where the first control voltage output to the voltage controlled-temperature compensated crystal oscillator is constant.

7. The PLL circuit according to claim 6, wherein a division ratio of the first divider and a division ratio of the second divider are adjusted and set so that a frequency output from the first divider and a frequency output from the second divider are equal to each other.

8. The PLL circuit according to claim 1, wherein a division ratio of the first divider and a division ratio of the second divider are adjusted and set so that a frequency output from the first divider and a frequency output from the second divider are equal to each other.

* * * * *